(12) United States Patent
Chuang et al.

(10) Patent No.: US 9,837,292 B2
(45) Date of Patent: Dec. 5, 2017

(54) UNDERFILL DISPENSING WITH CONTROLLED FILLET PROFILE

(71) Applicant: Taiwan Semiconductor Manufacturing Company, Ltd., Hsin-Chu (TW)

(72) Inventors: Chun-Chih Chuang, Hsin-Chu (TW); Jung Wei Cheng, Hsin-Chu (TW); Chun-Hung Lin, Taipei (TW); Tsung-Ding Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 140 days.

(21) Appl. No.: 14/930,032

(22) Filed: Nov. 2, 2015

(65) Prior Publication Data
US 2016/0056063 A1 Feb. 25, 2016

Related U.S. Application Data

(62) Division of application No. 14/255,505, filed on Apr. 17, 2014, now Pat. No. 9,177,835.

(51) Int. Cl.
H01L 21/56 (2006.01)
H01L 21/67 (2006.01)

(52) U.S. Cl.
CPC ...... *H01L 21/67126* (2013.01); *H01L 21/563* (2013.01); *H01L 2224/16225* (2013.01); *H01L 2224/32225* (2013.01); *H01L 2224/73204* (2013.01)

(58) Field of Classification Search
CPC ...... B29C 39/10; B29C 39/126; H01L 21/563
See application file for complete search history.

(56) References Cited

U.S. PATENT DOCUMENTS

| | | | |
|---|---|---|---|
| 5,817,545 A | 10/1998 | Wang et al. | |
| 6,821,818 B2* | 11/2004 | Chen | H01L 21/56 257/E21.502 |
| 8,120,170 B2* | 2/2012 | McLellan | H01L 21/561 257/675 |
| 8,945,983 B2* | 2/2015 | Liu | H01L 23/18 257/687 |
| 2004/0232560 A1* | 11/2004 | Su | H01L 21/563 257/778 |
| 2011/0020983 A1 | 1/2011 | Tomura et al. | |

* cited by examiner

*Primary Examiner* — Robert B Davis
(74) *Attorney, Agent, or Firm* — Slater Matsil, LLP

(57) ABSTRACT

A method includes placing an underfill-shaping cover on a package component of a package, with a device die of the package extending into an opening of the underfill-shaping cover. An underfill is dispensed into the opening of the underfill-shaping cover. The underfill fills a gap between the device die and the package component through capillary. The method further includes, with the underfill-shaping cover on the package component, curing the underfill. After the curing the underfill, the underfill-shaping cover is removed from the package.

20 Claims, 11 Drawing Sheets

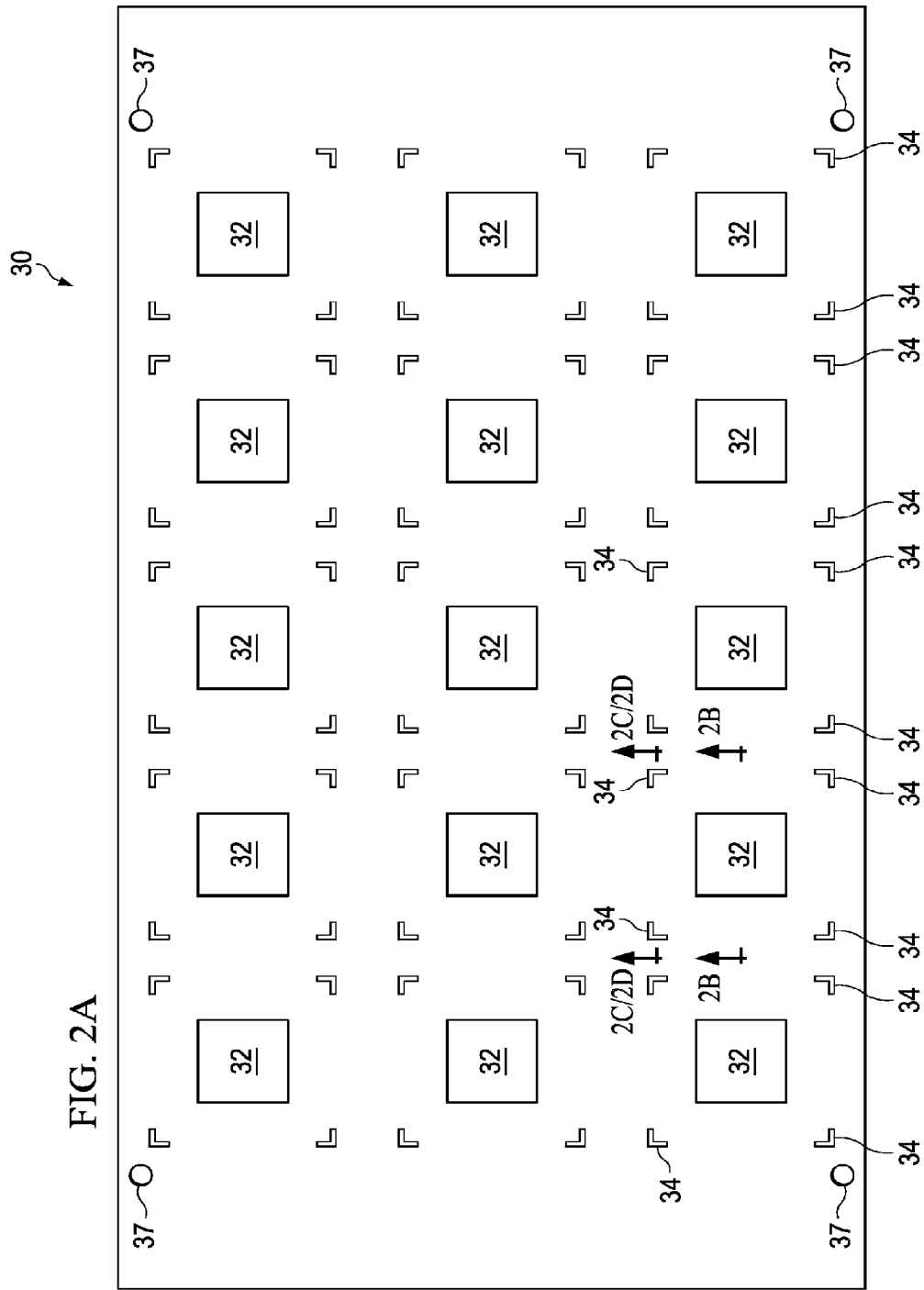

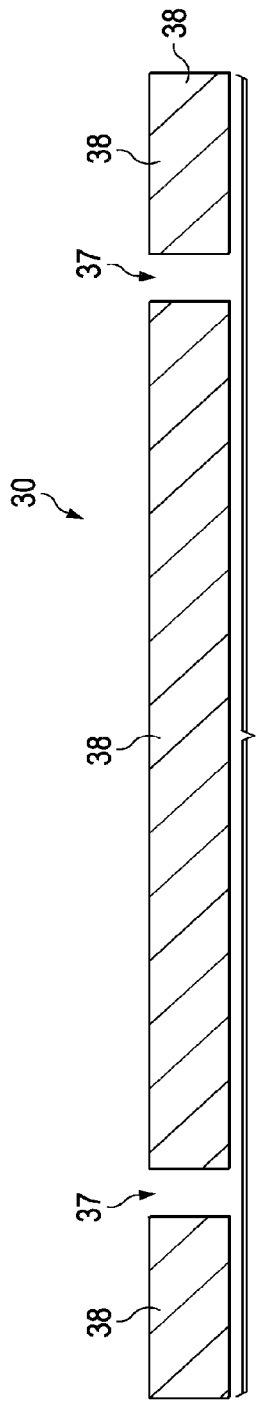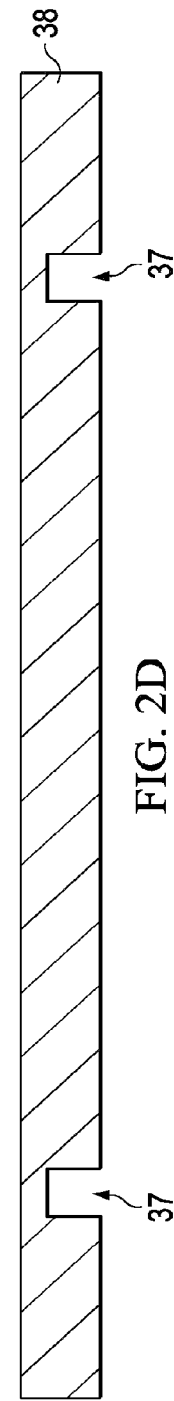
FIG. 2B
FIG. 2C
FIG. 2D

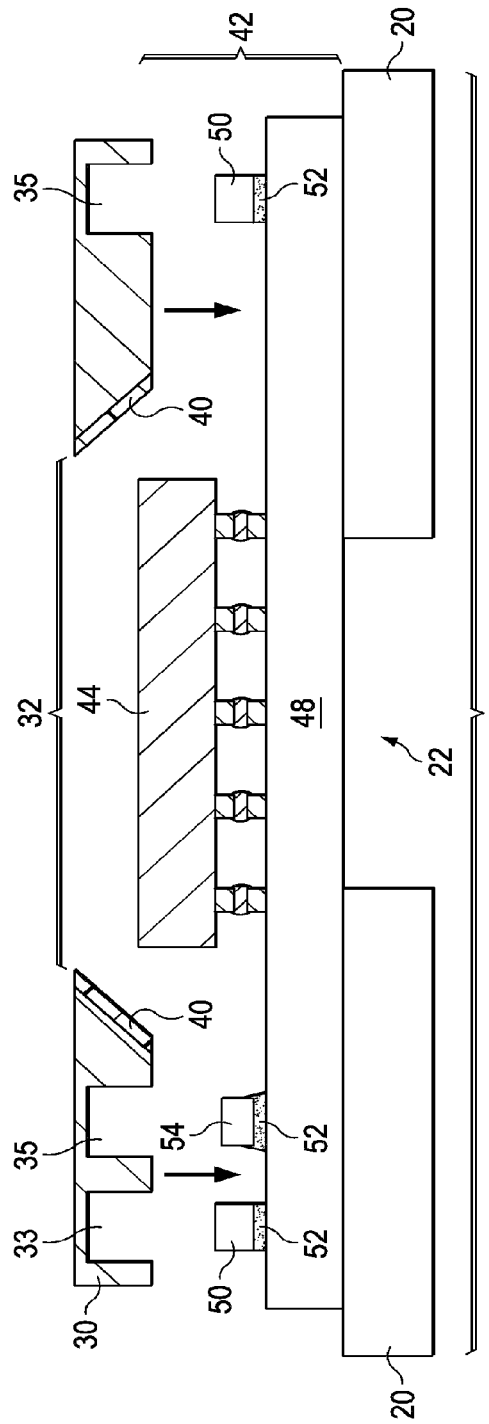
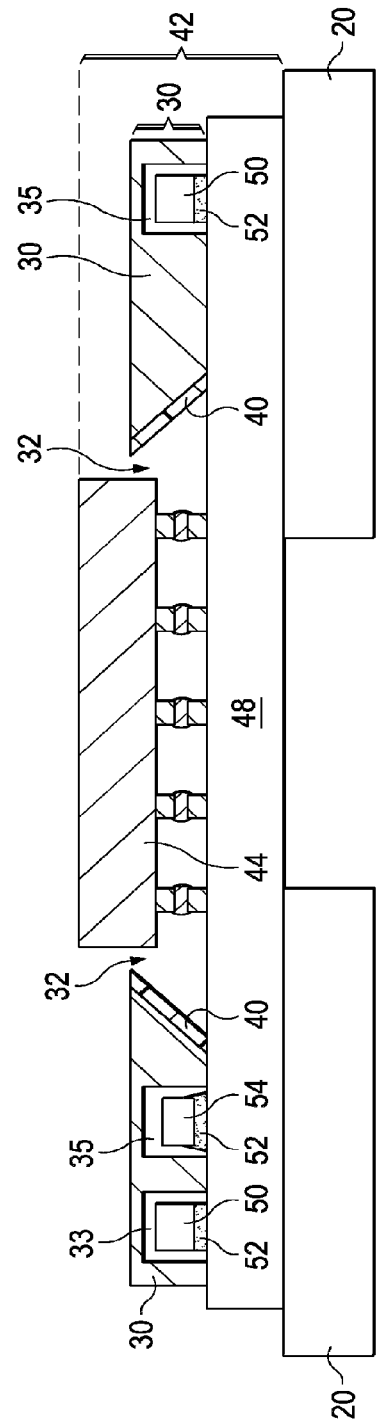
FIG. 5
FIG. 6

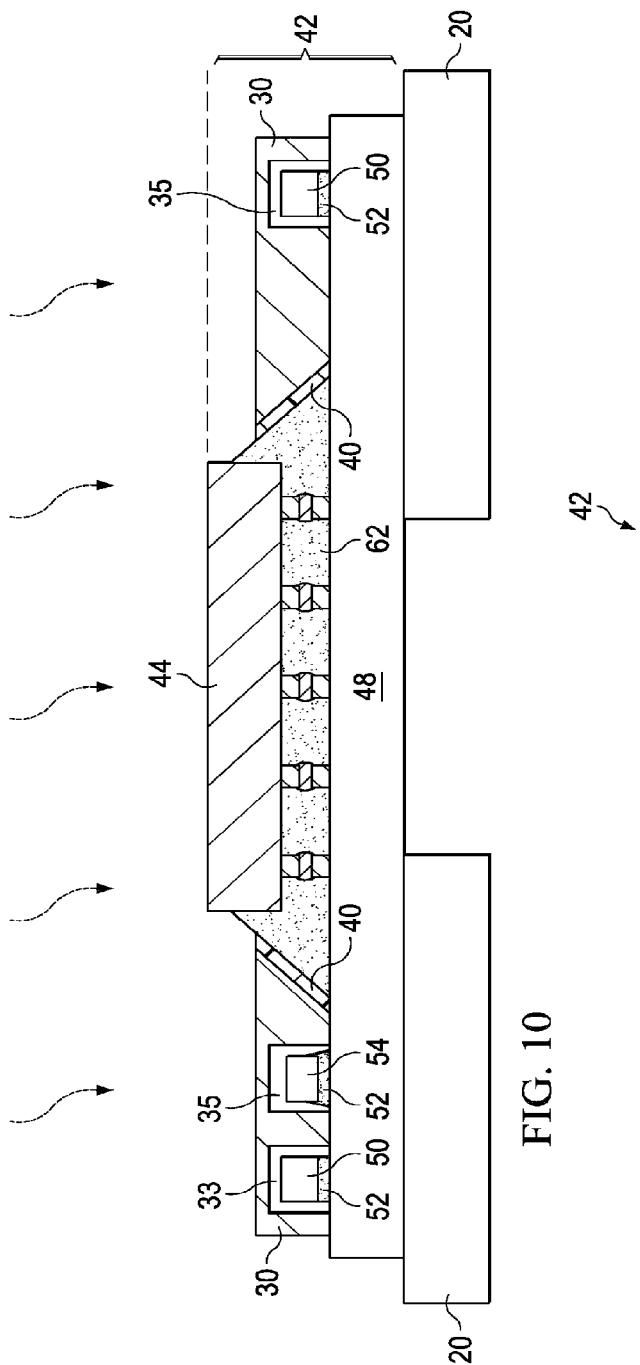
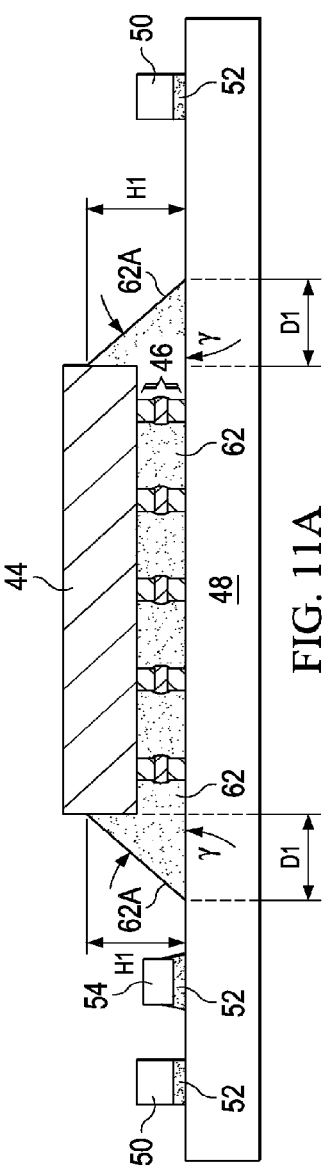
FIG. 10
FIG. 11A

UNDERFILL DISPENSING WITH CONTROLLED FILLET PROFILE

PRIORITY CLAIM AND CROSS-REFERENCE

This application is a divisional of U.S. patent application Ser. No. 14/255,505, entitled "Underfill Dispensing with Controlled Fillet Profile," filed on Apr. 17, 2014, which application is incorporated herein by reference.

BACKGROUND

Device dies, which include integrated circuit devices such as transistors therein, are often bonded to other package components such as package substrates, interposers, and Printed Circuit Boards (PCBs). The bonding may be performed through solder bonding, direct metal bonding, or the like. Since the device dies and the respective underlying package components have different Coefficients of Thermal Expansion (CTEs), the bonding structures such as the solder regions and metal pads often suffer from high stresses. For example, the CTEs of package substrates are often significantly greater than the CTE of silicon. As a result, due to the heating and cooling processes in the bonding process, stresses are applied to the bonding structures. To solve this problem, underfill is dispensed between the device dies and the underlying package components to protect the bonding structures.

The dispensing of underfill is through capillary. For example, to dispense the underfill into the gap between a device die and a package substrate, the underfill is dispensed onto a surface of the package substrate, wherein the underfill contacts a side of the device die. The underfilling process includes a plurality of dispensing steps, with a waiting time following each of the dispensing steps since the capillary takes time. During the waiting time, the underfill moves into the gap through capillary. Each of the dispensing steps and the respective waiting time causes the underfill to move further in the gap through capillary, until the underfill reaches the opposite end of the gap.

The conventional dispensing method often results in a wide fillet of underfill on the side that the underfill is dispensed. On other sides of the device dies, the fillet is significantly narrower. This causes non-uniformity in the profile of the underfill. Since underfill applies stresses to the device die and the bonding structures between the device die and the package substrate, the non-uniformity in the profile of the underfill causes the stress applied on different parts of the device dies and the bonding structures to be non-uniform. Furthermore, the fillet width may be different from package to package, and it is hard to determine and compensate for the stresses. Moreover, the wide fillet of underfill may restrict further processes, such as lid attachment or Package on Package (POP) bonding, which processes occur in the regions near the device die.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A, 2B, 2C, and 2D illustrate a top view of and cross-sectional views of an underfill-shaping cover in accordance with some embodiments;

FIGS. 4 through 10 illustrate cross-sectional views of intermediate stages in an underfilling process in accordance with some embodiments;

FIG. 11A illustrates the cross-sectional view of an exemplary package including the dispensed underfill in accordance with some embodiments.

DETAILED DESCRIPTION

Figure 1A:
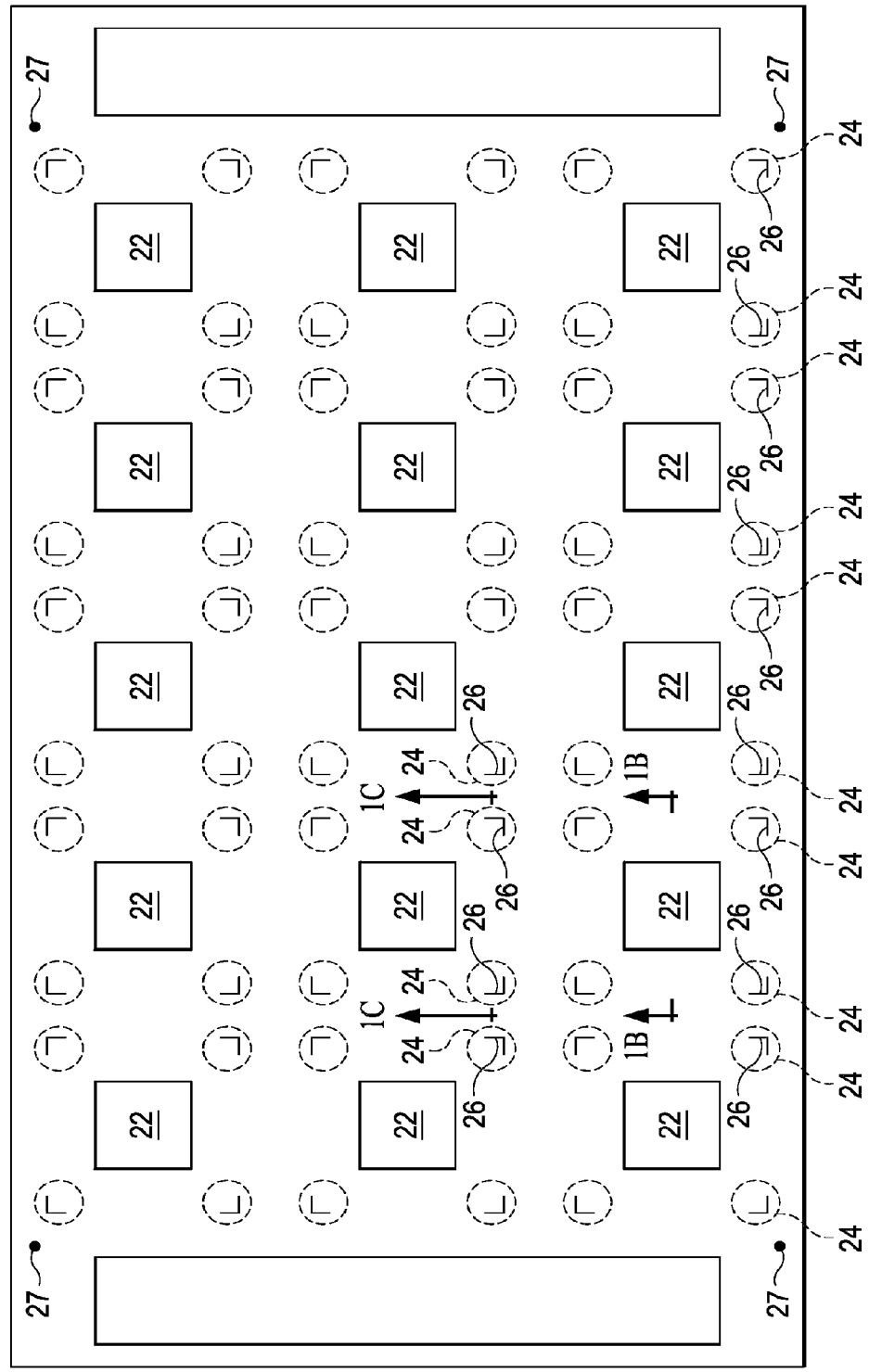
FIGS. 1A, 1B, and 1C illustrate a top view of and cross-sectional views of an underfill-dispensing boat in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package and the method of dispensing underfill into the package are provided in accordance with various exemplary embodiments. The intermediate stages of dispensing the underfill are illustrated. The variations of the embodiments are discussed. Throughout the various views and illustrative embodiments, like reference numbers are used to designate like elements.

FIG. 1A illustrates a top view of underfill-dispensing boat 20 in accordance with some embodiments. Underfill-dispensing boat 20 is designed to place packages 42 (refer to FIG. 4) thereon. Accordingly, the size and the shape of underfill-dispensing boat 20 are design to fit the number and the respective sizes of packages 42. For example, FIG. 1A illustrates that underfill-dispensing boat 20 is designed to fit 3×5 packages 42.

Figure 7:
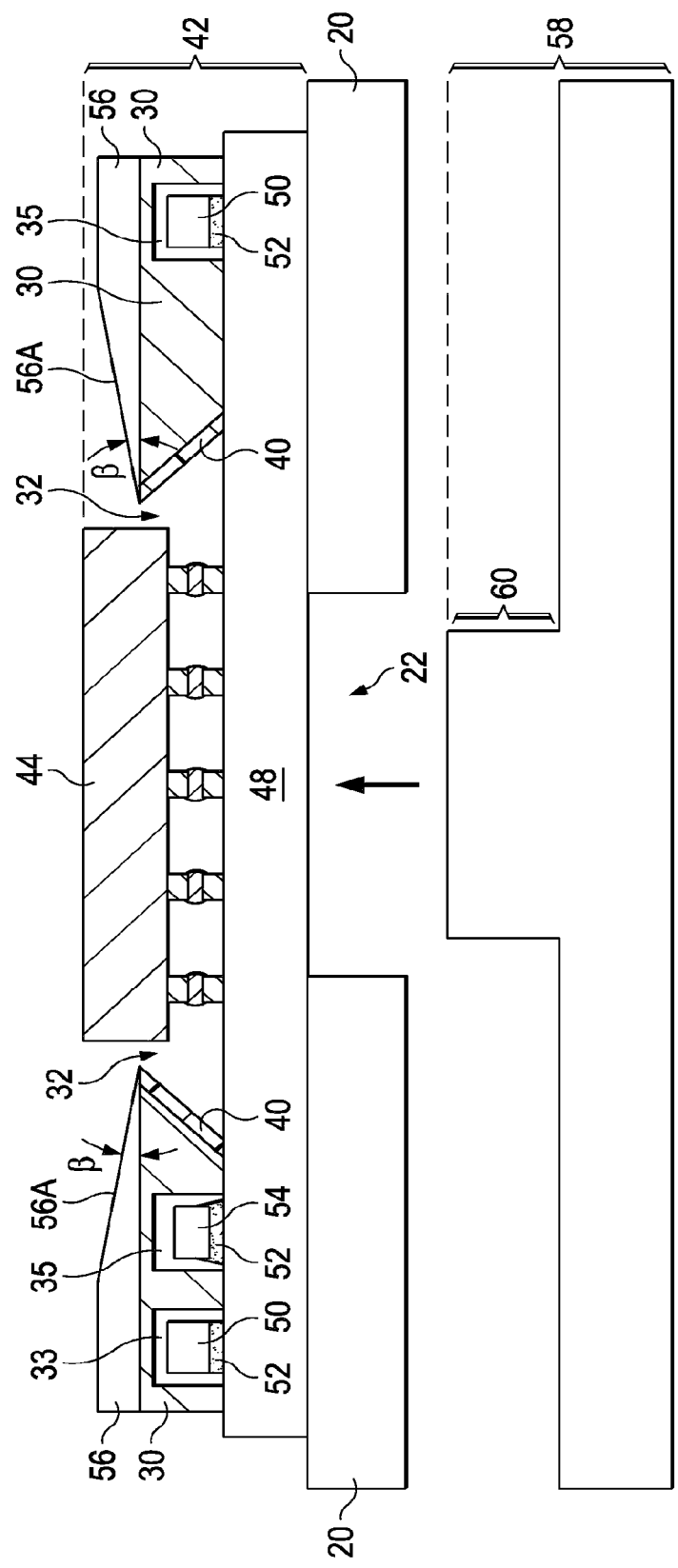
Figure 8:
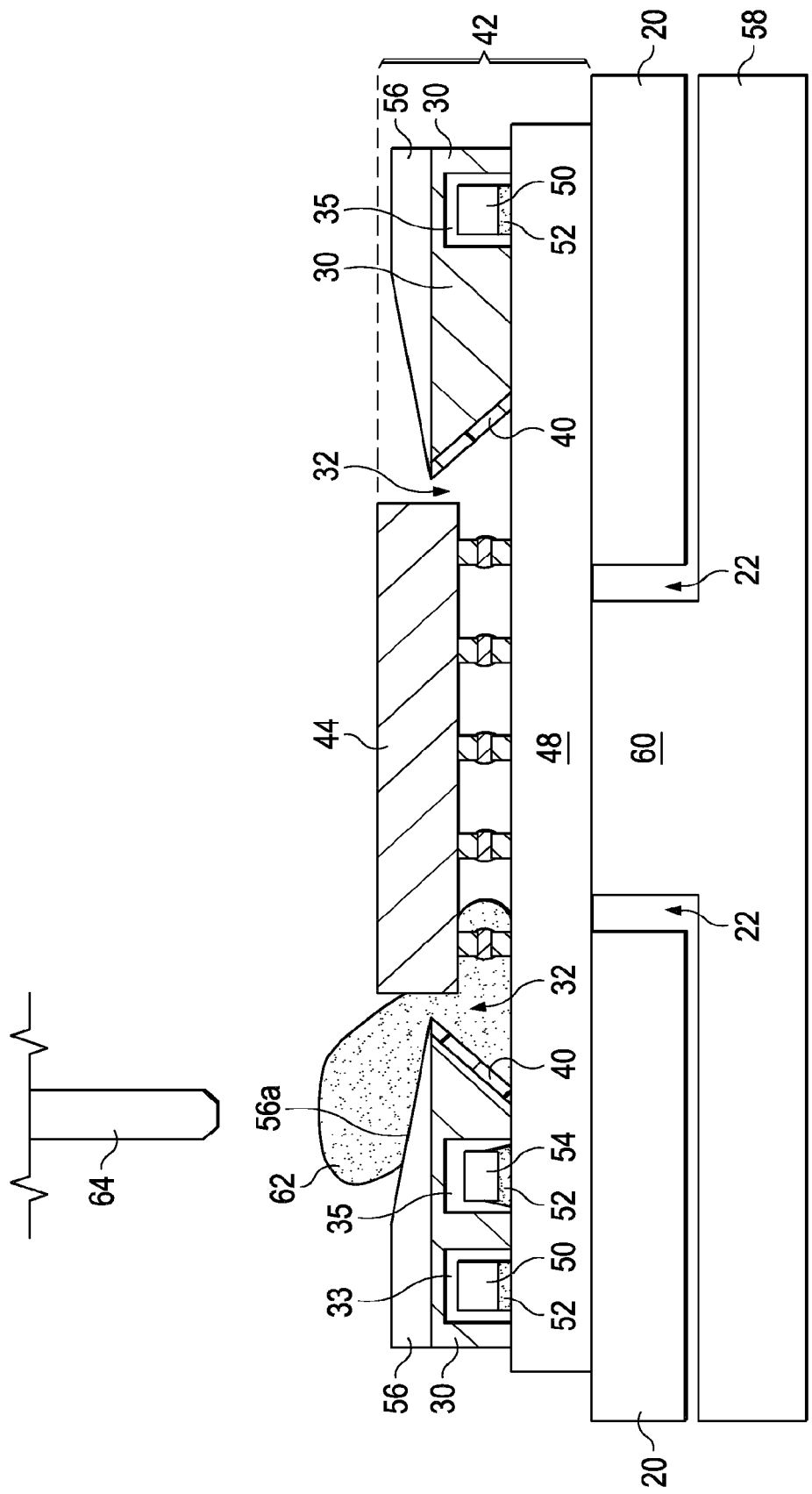

In the illustrated embodiments, underfill-dispensing boat 20 includes a plurality of through-openings 22, which are designed to allow the protrusions 60 of stage 58 to penetrate through, as will be shown in FIGS. 7 and 8. In alternative embodiments, underfill-dispensing boat 20 does not include the illustrated through-openings 22.

A plurality of magnets 24 is embedded in underfill-dispensing boat 20. Although FIG. 1A illustrates that there are four magnets 24 disposed to the four corners of each of through-openings 22, magnets 24 may also be disposed with other applicable layouts. Since magnets 24 are disposed close to the bottom side of underfill-dispensing boat 20, as shown in FIG. 1C, magnets 24 are illustrated using dashed lines in FIG. 1A.

Furthermore, a plurality of guide pins 26 is secured on the top surface of underfill-dispensing boat 20. Also, although FIG. 1A illustrates that there are four guide pins 26 disposed to the four corners of each of through-openings 22, guide pins 26 may also be disposed with other applicable layouts.

FIG. 1A also illustrate a plurality of guide pins 27, which are disposed to the corners of underfill-dispensing boat 20. Although FIG. 1A illustrates that there are four guide pins 27 disposed to the four corners of underfill-dispensing boat 20, guide pins 27 may also be disposed with other applicable layouts, and may have different numbers equal to or greater than three. Guide pins 27 may be formed of a metal such as aluminum, copper, stainless steel, for example. In alternative embodiments, guide pins 27 are formed of organic or inorganic materials, providing guide pins 26 can sustain the temperatures adopted in the heating and curing of the underfill that is to be dispensed.

Figure 1B:
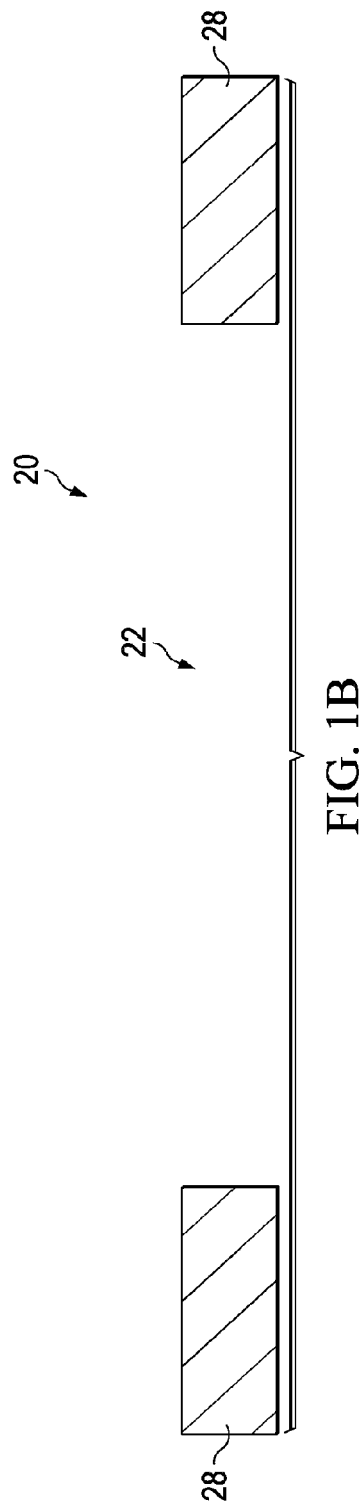
Figure 1C:
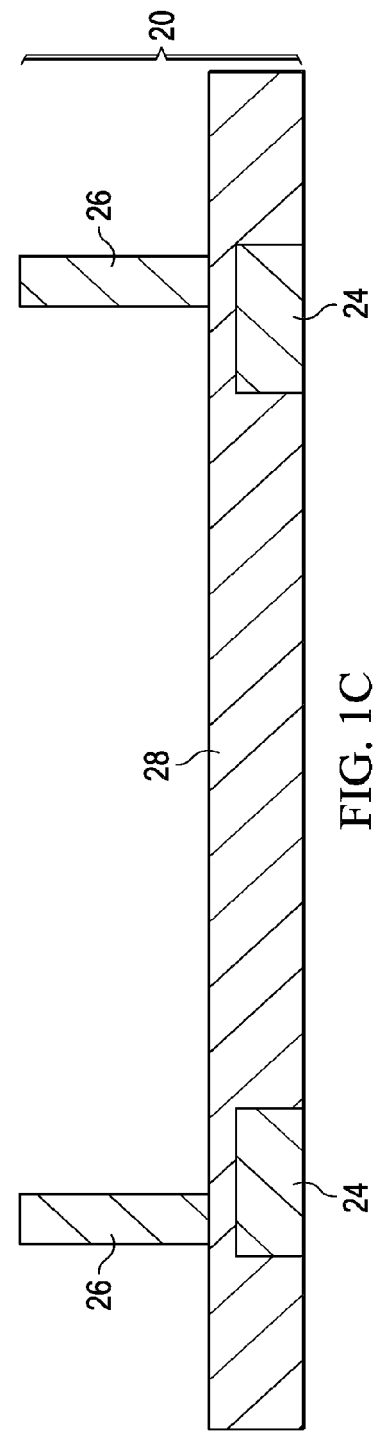

FIG. 1B illustrates a cross-sectional view of a portion of underfill-dispensing boat 20, wherein the cross-sectional view is obtained from the plane containing line 1B-1B in FIG. 1A. FIG. 1B illustrates that underfill-dispensing boat 20 includes base plate 28, wherein through-opening 22 extends from the top surface to the bottom surface of base plate 28. Base plate 28 may be formed of the materials including, but not limited to, metals (such as aluminum or stainless steel), organic materials, glass fiber, ceramic, combinations thereof, and multi-layers thereof.

FIG. 1C illustrates a cross-sectional view of a portion of underfill-dispensing boat 20, wherein the cross-sectional view is obtained from the plane containing line 1C-1C in FIG. 1A. FIG. 1C illustrates that underfill-dispensing boat 20 includes magnets 24 embedded into base plate 28 from the bottom side of base plate 28. In addition, guide pins 26 are attached to and secured on base plate 28, and protrude above the top surface of base plate 28. Guide pins 26 are used to limit the movement of package component 48 (FIG. 3), and also have the function of guiding the placement of package component 48. Guide pins 26 may be formed of a metal such as aluminum, copper, stainless steel, for example. In alternative embodiments, guide pins 26 are formed of organic or inorganic materials, providing guide pins 26 can sustain the temperatures adopted in the heating and curing of the underfill that is to be dispensed.

FIG. 2A illustrates a top view of underfill-shaping cover 30 in accordance with some embodiments. Underfill-shaping cover 30 is designed to shape the underfill during the underfill process. The size and shape of underfill-shaping cover 30 are also design to fit the number and the respective sizes of package 42, as shown in FIG. 5.

Furthermore, a plurality of openings 37, which are used to align underfill-shaping cover 30 to the underlying underfill-dispensing boat 20, is formed in underfill-shaping cover 30. In some embodiments, openings 37 are through-openings, and hence are referred to as through-openings 37 hereinafter, as shown in FIG. 2C. In alternative embodiments, openings 37 are not through-openings. Rather, openings 37 extend from the bottom surface of underfill-shaping cover 30 up to an intermediate level of underfill-shaping cover 30, as shown in FIG. 2D. Also, although FIG. 2A illustrates that there are four through-openings 37 disposed to the four corners of underfill-shaping cover 30, through-openings 37 may also be disposed with other applicable layouts, and may have different numbers equal to or greater than three. The sizes, shapes, and the positions of through-openings 37 are designed to fit the sizes, shapes, and the positions of guide pins 27 (FIG. 1A), so that guide pins 27 may be inserted into openings 37 in order to align underfill-shaping cover 30 to the underlying underfill-dispensing boat 20.

In accordance with the embodiments of the present disclosure, the positions of through-openings 32 are designed to be aligned to the positions of through-openings 22 in FIG. 1A when underfill-shaping cover 30 is aligned to underfill-dispensing boat 20.

In the illustrative embodiments in FIGS. 1C and 2C, guide pins 27 are attached to underfill-dispensing boat 20, and openings 37 for inserting guide pins 27 therein are formed in underfill-shaping cover 30. In alternative embodiments (not shown), guide pins 27 are attached to underfill-shaping cover 30, while openings 37 for inserting guide pins 27 therein are formed in underfill-dispensing boat 20. In yet alternative embodiments, underfill-dispensing boat 20 may include both guide pins and through-openings, and underfill-shaping cover 30 may include both guide pins and through-openings also, wherein the guide pins fit into the respective through-openings.

FIG. 2B illustrates a cross-sectional view of a portion of underfill-shaping cover 30, wherein the cross-sectional view is obtained from the plane containing line 2B-2B in FIG. 2A. FIG. 2B illustrates that underfill-shaping cover 30 includes base plate 38, wherein through-opening 32 extends from the top surface to the bottom surface of base plate 38. Base plate 38 may be formed of an iron-containing material. Underfill-shaping cover 30 includes slant sidewalls 32A that are neither parallel to nor perpendicular to the major top surface 30A and the major bottom surface 30B of underfill-shaping cover 30. The slant angle α of slant sidewalls 32A may be in the range between about 30 degrees and about 60 degrees. It is appreciated, however, that the values recited throughout the description are merely examples, and may be changed to different values.

Non-sticking material 40 is coated on the slant sidewalls 32A of underfill-shaping cover 30. Non-sticking material 40 has the property not to stick to cured underfill, so that the cured underfill may be released from non-sticking material 40. Accordingly, non-sticking material 40 is also referred to as an underfill-releasing coating. In some embodiments, non-sticking material 40 comprises releasing agents, Polytetrafluoroethylene (PTFE) (known as Teflon, a registered trademark of Dupont), or other applicable materials. Although not shown, the non-sticking material 40 may also be coated on the top surface and/or bottom surface of underfill-shaping cover 30. Although FIG. 2B illustrates two sidewalls of opening 32, all four sidewalls of opening 32 may have essentially the same profile as illustrated in FIG. 2B, and have non-sticking material 40 coated thereon.

FIG. 2C illustrates a cross-sectional view of a portion of underfill-shaping cover 30, wherein the cross-sectional view is obtained from the plane containing line 2C/2D-2C/2D in FIG. 2A. FIG. 2C illustrates that underfill-shaping cover 30 includes through-openings 37. In alternative embodiments, as shown in FIG. 2D, underfill-shaping cover 30 includes openings 37 that do not penetrate through base plate 38.

Figure 3:
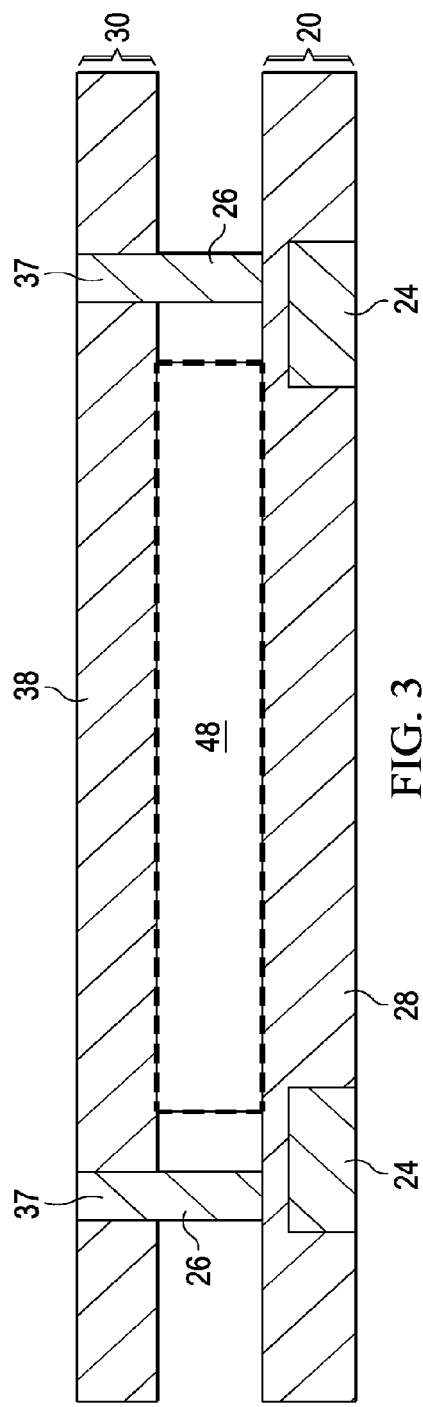
FIG. 3 illustrates a cross-sectional view showing how the underfill-dispensing boat and the underfill-shaping cover are aligned through guide pins in accordance with some embodiments.

FIG. 3 illustrates an exemplary embodiment in which guide pins 26 are used to guide package component 48 to the desirable position of underfill-dispensing boat 20. Package component 48 is illustrated as being disposed between underfill-shaping cover 30 and underfill-dispensing boat 20 (also refer to FIG. 6). The cross-sectional view shown in FIG. 3 is obtained from the plane containing line 1C-1C in FIG. 1A. Accordingly, package component 48 is illustrated using dashed lines to indicate that it is not in the illustrated plane. As shown in FIG. 3, during the alignment, guide pins 26 are close to package component 48, so that package component 48 is aligned to its intended position, and is not able to move.

Figure 4:
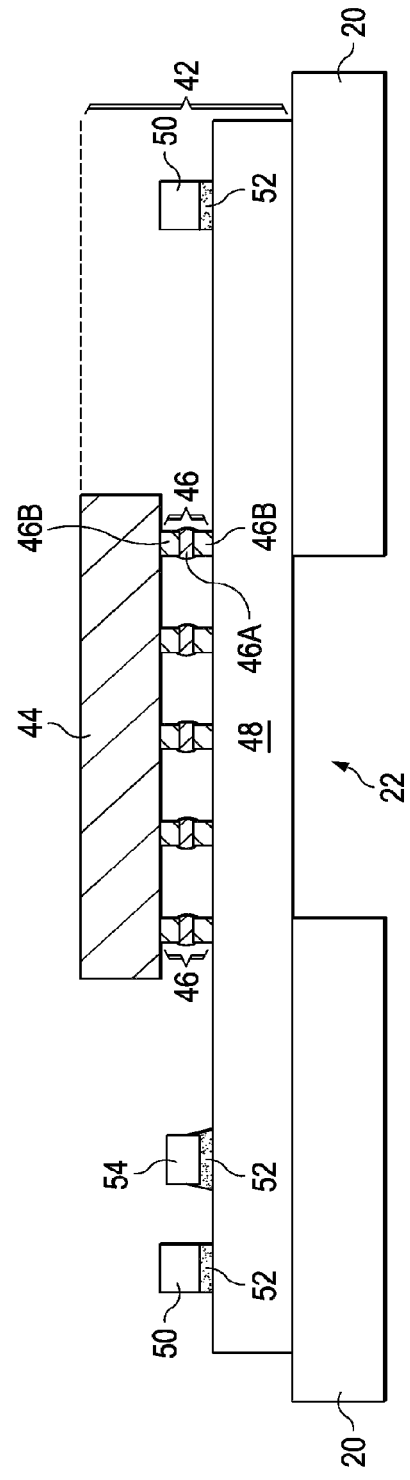

FIGS. 4 through 10 illustrate the cross-sectional views in an exemplary underfill-dispensing process in accordance with the embodiments of the present disclosure. Referring to FIG. 4, package 42 is placed on underfill-dispensing boat 20. In the embodiments in which underfill-dispensing boat 20 includes through-opening 22, package 42 covers through-opening 22. It is appreciated that although FIGS. 4 through 10 illustrate one package 42, in the subsequently discussed underfill-dispensing process, a plurality of packages 42 is placed on underfill-dispensing boat 20 (FIG. 1A), with each of packages 42 being aligned to one of through-opening 22 by guide pins 26. The underfilling process is also performed on other packages 42.

In some embodiments, package 42 includes device die 44 bonded to the underlying package component 48 through bonding structures 46. Device die 44 may include integrated circuit devices such as transistors, resistors, capacitors, and diodes (not shown). Package component 48 may be a package substrate, an interposer, a Printed Circuit Board (PCB), a package, or the like. Package component 48 may also include electrical connections (not shown, such as redistribution lines and vias) configured to route signals between the features (not shown) on the top surface and the features on the bottom surface of package component 48. Bonding structures 46 may include solder regions 46A and metal pads/pillars 46B in some exemplary embodiments. In alternative embodiments, bonding structures 46 may be direct metal-to-metal bonding structures.

In some embodiments, besides device die 44, there are other components bonded or attached to the top surface of package component 48. For example, FIG. 4 illustrates stiffener ring 50 attached to package component 48 through adhesive 52. In addition, passive devices may also be bonded to, and electrically coupled to, the top surface of package component 48. For example, FIG. 4 illustrates passive device 54, which may be a resistor, a capacitor, a transmitter, an inductor, or the like. In alternative embodiments, package 42 may not include some or all of the illustrated components 50 and 54.

Referring to FIGS. 5 and 6, underfill-shaping cover 30 is placed on package 42. Underfill-shaping cover 30 is aligned to the underlying underfill-dispensing boat 20 using the alignment mechanism shown in FIG. 3. Furthermore, underfill-shaping cover 30 is secured to the underlying underfill-dispensing boat 20 through the magnetic force between underfill-shaping cover 30 (which includes a paramagnetic material such as iron) and the underlying magnets 24 (FIG. 3). The through-opening 32 is aligned to device die 44, and device die 44 extends into through-opening 32. The underfill-shaping cover 30 may also include openings 33 and/or 35, wherein opening 33 forms is designed as an opening ring to fit stiffener ring 50, and opening 35 is designed to fit passive device 54. Accordingly, after underfill-shaping cover 30 is placed on package 42, as shown in FIG. 6, stiffener ring 50 is resided in opening 33, and passive device 54 is resided in opening 35. By forming openings such as 33 and 35, the bottom surface of underfill-shaping cover 30 may be placed on the top surface of package component 48 without being hampered by the components that are attached or bonded to the top surface of package component 48.

FIG. 7 illustrates some exemplary embodiments in which dispense cover 56 is placed on the top surface of underfill-shaping cover 30. In some embodiments, dispense cover 56 has essentially the same top-view shape as the top-view shape of underfill-shaping cover 30. Dispense cover 56 also includes openings that overlap, and having the same top-view shape and size, as the openings 32 of underfill-shaping cover 30. Furthermore, dispense cover 56 includes slanted surfaces 56A, which are tilted toward opening 32. The surface material of 56 may have a surface tension lower than the surface tension of underfill 62 (FIG. 8). For example, the surface material of 56 is not sticky to underfill 62. In some embodiments, the slant angle β of slanted surface 56A is greater than 0 degree and smaller than 90 degrees, and may be in the range between about 20 degrees and about 45 degrees. In alternative embodiments, no dispense cover is placed on underfill-shaping cover 30.

Throughout the description, underfill-dispensing boat 20 and underfill-shaping cover 30 are in combination referred to as an underfill-dispensing tool set, which is used for the dispensing of underfill. In addition, the underfill-dispensing tool set may further include dispense cover 56 in some embodiments.

Underfill-dispensing boat 20, the overlying packages 42, underfill-shaping cover 30, and dispense cover 56 are then placed on stage 58, which includes protruding portion 60. Protruding portion 60 extends into opening 22 to contact the bottom surface of package component 48. Stage 58 is configured to secure underfill-dispensing boat 20, for example, through vacuum, and is configured to heat package 42.

FIG. 8 illustrates the dispensing of underfill 62, wherein dispensing nozzle 64 is used to dispense underfill 62 on the slanted surface 56A of dispense cover 56. Since the surface tension of dispense cover 56 is smaller than the surface tension of underfill 62, underfill 62 does not spread on surface 56A. Rather, underfill 62 tends to form a ball shape, and flows into opening 32 (FIG. 7).

Figure 9:
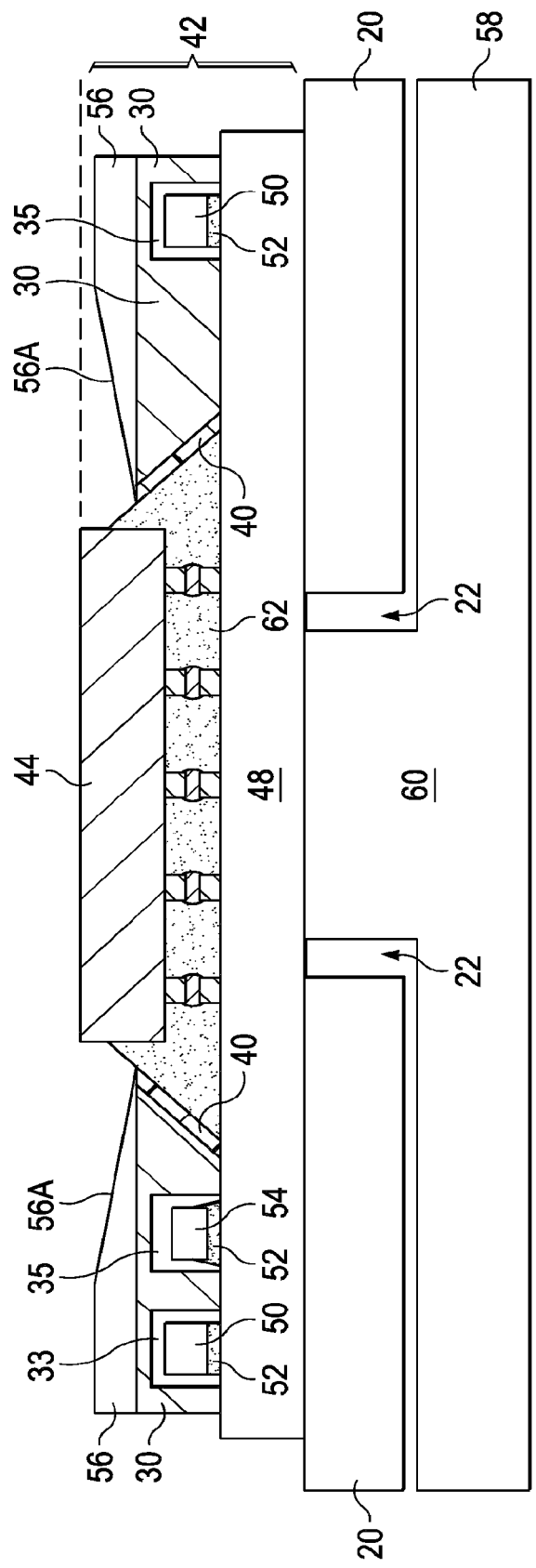

FIG. 9 illustrates the underfill 62 after the capillary, which causes underfill 62 to be filled into the gap between device die 44 and package component 48. In some embodiments, package 42 is heated by stage 58 to help the capillary. The temperature of package 42 may be between about 80° C. and about 100° C., for example. The slanted sidewalls of underfill-shaping cover 30 confine the profile of underfill 62 to a desirable shape. The amount of underfill 62 is controlled, so that opening 32 is at least substantially fully filled.

Referring back to FIG. 8, in alternative embodiments in which dispense cover 56 is not used, dispensing nozzle 64 will be aimed at opening 32, so that underfill 62 is dispensed into opening 32 directly.

Next, after the step in FIG. 9 is finished, dispense cover 56 is removed, and the resulting structure is shown in FIG. 10. Underfill 62 is cured, wherein the curing is represented by the curved arrows. The curing process may be performed using thermal curing, Infrared (IR) curing, or the like. For example, in a thermal curing process, underfill-dispensing boat 20, packages 42, underfill-shaping cover 30, and underfill 62 are removed from stage 58 (FIG. 9), and are placed in an oven (not shown) to perform the curing process, until underfill 62 is solidified.

After the curing, underfill-dispensing boat 20 and underfill-shaping cover 30 are removed from package 42, and FIG. 11A illustrates the resulting package 42. Since non-sticking material 40 (FIG. 10) is not sticky to underfill 62, underfill-shaping cover 30 can be removed easily without damaging underfill-shaping cover 30 and package 42. Underfill-dispensing boat 20 and underfill-shaping cover 30 may then be reused.

As shown in FIG. 11A, underfill 62 includes slanted surfaces 62A, wherein are shaped by the slanted sidewalls of underfill-shaping cover 30. The slanted surfaces 62A may extend from the sidewalls of device die 44 to the top surface of package component 48.

Figure 11B:
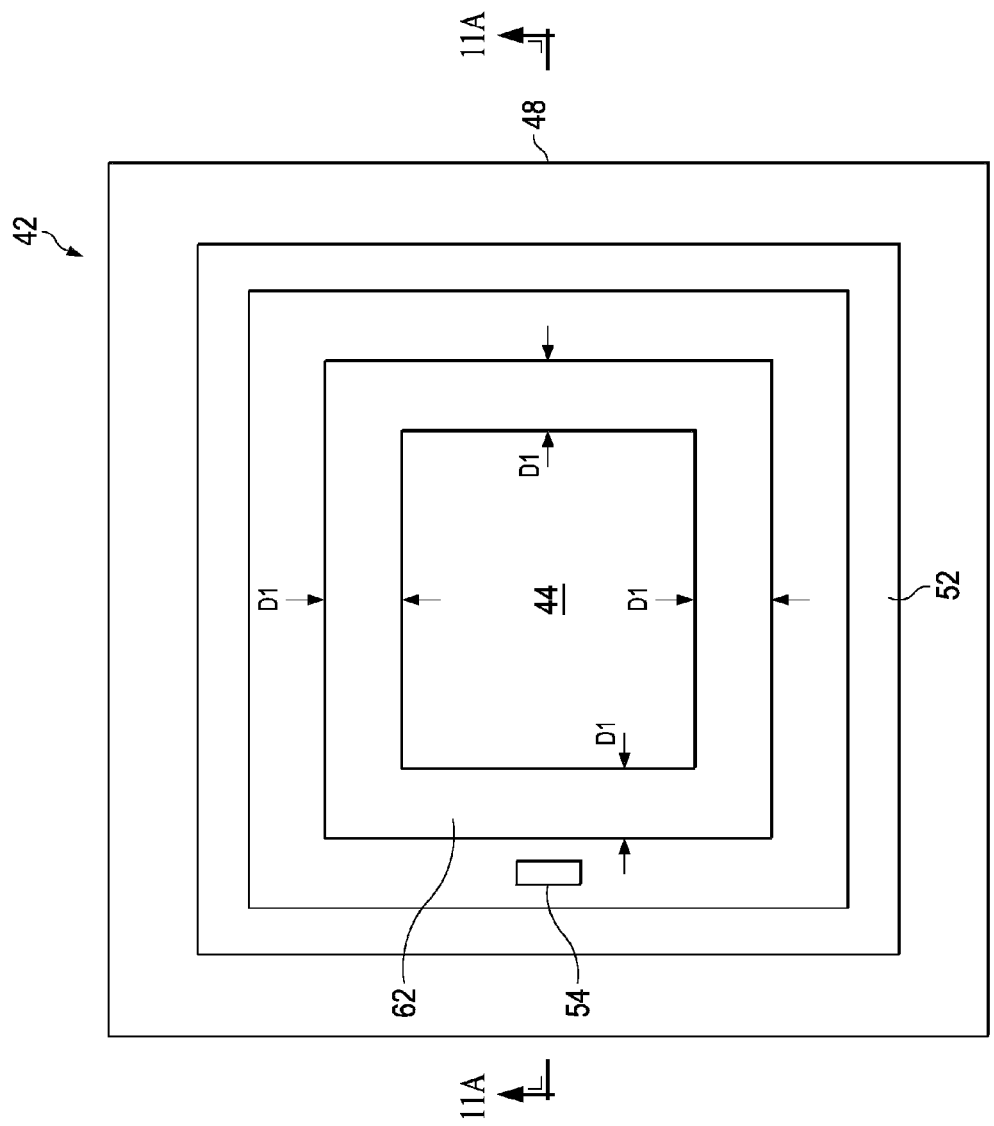
FIG. 11B illustrates the top view of an exemplary package including the dispensed underfill in accordance with some embodiments.

FIG. 11B illustrates a top view of package 42, wherein the cross-sectional view shown in FIG. 11A is obtained from the plane containing line 11A-11A in FIG. 11B. It is observed that due to the confinement of underfill-shaping cover 30, underfill 62 has four sides extending outwardly from the four sides of device die 44. The four sides of underfill 62 may have the same profile. For example, the slant angle γ (as shown in FIG. 11A) of all four sides of underfill 62 are substantially the same. The heights H1 (FIG. 11A) of four slant surfaces of underfill 62 may also be the same or substantially the same, for example, with the variations being smaller than about 20 percent, smaller than about 10 percent, or smaller than about 5 percent of height H1 of either side of underfill 62. The four sides of underfill 62 may also spread outwardly for the same distance or substantially the same distance D1, for example, with the variations being smaller than about 20 percent, smaller than about 10 percent, or smaller than about 5 percent of distance D1 of either side of underfill 62. Ratio D1/H1 is smaller than 5.0, and may be smaller than about 2:1. As a comparison, in conventional methods for dispensing the underfill, the side from which the underfill is dispensed has a D1/H1 ratio greater than 5.0. The other sides, on the other hand, have smaller D1/H1 ratios, for example, smaller than about 2:1.

The embodiments of the present disclosure have some advantageous features. By using underfill-shaping cover 30 to help the underfill dispensing, the profile of all four sides of the underfill is uniform. Furthermore, the width of the underfill can be controlled. Since the profile and the width of the underfill affect the stress applied on bonding structures (such as 46 in FIG. 11A) and device die 44, the stress is more controllable and predictable, and the reliability of the resulting package is improved.

In accordance with some embodiments of the present disclosure, a method includes placing an underfill-shaping cover on a package component of a package, with a device die of the package extending into an opening of the underfill-shaping cover. An underfill is dispensed into the opening of the underfill-shaping cover. The underfill fills a gap between the device die and the package component through capillary. The method further includes, with the underfill-shaping cover on the package component, curing the underfill. After the curing the underfill, the underfill-shaping cover is removed from the package.

In accordance with alternative embodiments of the present disclosure, a package includes a package component, a device die over and bonded to the package component, and an underfill in a gap between the package component and the device die. The underfill has slanted sidewalls extending from a surface of the package component to a sidewall of the device die. The underfill extends beyond four edges of the device die in four lateral directions for substantially a same distance.

In accordance with yet alternative embodiments of the present disclosure, an underfill-dispensing tool set is used for dispensing an underfill. The underfill-dispensing tool set includes an underfill-dispensing boat and an underfill-shaping cover. The underfill-shaping cover includes an opening, and a non-sticking material on sidewalls of the opening, wherein the non-sticking material is not sticky to the underfill. The underfill-dispensing tool set further includes a plurality of guide pins attached to a first one of the underfill-dispensing boat and the underfill-shaping cover, and a plurality of openings in a second one of the underfill-dispensing boat and the underfill-shaping cover. The plurality of guide pins is configured to be inserted into the plurality of guide pins.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An underfill-dispensing tool set for dispensing an underfill, the underfill-dispensing tool set comprising:
   an underfill-dispensing boat;
   an underfill-shaping cover comprising:
      a first through-opening; and
      a non-sticking material on a sidewall of the first through-opening, wherein the non-sticking material is not sticky to the underfill;
   a plurality of guide pins attached to a first one of the underfill-dispensing boat and the underfill-shaping cover; and
   a plurality of openings in a second one of the underfill-dispensing boat and the underfill-shaping cover, wherein the plurality of guide pins is configured to be inserted into the plurality of openings.

2. The underfill-dispensing tool set of claim 1 further comprising:
   a dispense cover comprising:
      a second through-opening; and
      a slanted top surface surrounding the second through-opening, wherein the slanted top surface tilts toward the second through-opening.

3. The underfill-dispensing tool set of claim 2, wherein the dispense cover has a top surface not sticky to the underfill.

4. The underfill-dispensing tool set of claim 3, wherein the dispense cover comprises Polytetrafluoroethylene (PTFE), with the slanted top surface being a surface of the PTFE.

5. The underfill-dispensing tool set of claim 1, wherein the sidewall of the first through-opening is a slanted sidewall.

6. The underfill-dispensing tool set of claim 5, wherein the slanted sidewall is straight.

7. The underfill-dispensing tool set of claim 1, wherein the underfill-dispensing boat comprises magnets embedded therein, and wherein the underfill-shaping cover comprises a paramagnetic material.

8. The underfill-dispensing tool set of claim 1, wherein the underfill-dispensing boat comprises an additional through-opening therein.

9. The underfill-dispensing tool set of claim 8 further comprising a stage comprising a protruding portion configured to fit into the additional through-opening.

10. An underfill-dispensing tool set for dispensing an underfill, the underfill-dispensing tool set comprising:
   an underfill-dispensing boat;
   an underfill-shaping cover configured to be aligned and fixed to the underfill-dispensing boat, the underfill-shaping cover comprising a first through-opening; and
   a dispense cover comprising:
      a second through-opening having substantially a same size as the first through-opening; and
      a slanted top surface surrounding the second through-opening, wherein the slanted top surface tilts toward the second through-opening.

11. The underfill-dispensing tool set of claim 10, wherein the underfill-shaping cover comprises a non-sticking material on a sidewall of the first through-opening, wherein the non-sticking material is not sticky to the underfill.

12. The underfill-dispensing tool set of claim 10, wherein the dispense cover has a top surface not sticky to the underfill.

13. The underfill-dispensing tool set of claim 10, wherein the underfill-shaping cover is configured that when the underfill-shaping cover is fixed to the underfill-dispensing boat, widths of the first through-opening closer to the underfill-dispensing boat are increasingly greater than widths of the first through-opening farther away from the underfill-dispensing boat.

14. The underfill-dispensing tool set of claim 10, wherein the underfill-shaping cover and the dispense cover have substantially a same top-view shape.

15. The underfill-dispensing tool set of claim 14, wherein the underfill-shaping cover comprises a first plurality of through-openings, and the dispense cover comprises a second plurality of through-openings have substantially same top-view shapes and sizes as the first plurality of through-openings.

16. The underfill-dispensing tool set of claim 10, wherein the dispense cover comprises Polytetrafluoroethylene (PTFE), with the slanted top surface being a surface of the PTFE.

17. An underfill-dispensing tool set for dispensing an underfill, the underfill-dispensing tool set comprising:
   an underfill-dispensing boat;
   an underfill-shaping cover configured to be aligned and fixed to the underfill-dispensing boat, the underfill-shaping cover comprising a first through-opening having a slanted sidewall; and
   a dispense cover comprising:
      a second through-opening having substantially a same size as the first through-opening; and
      a slanted top surface surrounding the second through-opening, wherein the dispense cover is configured that when the dispense cover is placed over the underfill-shaping cover, and when the second through-opening is aligned to the first through-opening, the slanted top surface and the slanted sidewall join with each other to form a tip, and the tip forms a ring.

18. The underfill-dispensing tool set of claim 17, wherein the underfill-shaping cover comprises a first plurality of through-openings identical to the first through-opening, and the dispense cover comprises a second plurality of through-openings identical to the second through-opening.

19. The underfill-dispensing tool set of claim 17, wherein the dated slanted top surface of the dispense cover is not sticky to the underfill, and the slanted sidewall of the underfill-shaping cover is not sticky to the underfill.

20. The underfill-dispensing tool set of claim 17, wherein the dispense cover comprises Polytetrafluoroethylene (PTFE), with the slanted top surface being a surface of the PTFE.

* * * * *